United States Patent [19]

Grundy

[11] Patent Number: 4,859,241

[45] Date of Patent: Aug. 22, 1989

[54] METAL FLAKE AND USE THEREOF

[75] Inventor: James Grundy, San Diego, Calif.

[73] Assignee: Johnson Matthey Inc., Valley Forge, Pa.

[21] Appl. No.: 852,846

[22] Filed: Apr. 16, 1986

[51] Int. Cl.$^4$ .................................................. B05B 7/00
[52] U.S. Cl. ................................. 106/1.14; 106/1.19; 75/0.5 A; 75/118 R; 75/251; 427/216; 427/419.8; 252/514; 252/518; 428/403
[58] Field of Search ............... 252/514, 518; 106/1.14, 106/1.19, 1.22; 75/0.5 A, 251, 118 R; 427/216, 220, 217, 419.8; 428/403, 407; 156/89; 241/3

[56] References Cited

U.S. PATENT DOCUMENTS

| | | | |
|---|---|---|---|
| 3,479,774 | 11/1969 | Eckslein | 51/116 |
| 4,273,583 | 6/1981 | Tyran | 75/0.5 A |
| 4,401,767 | 8/1983 | Dietz et al. | 106/1.14 |
| 4,436,785 | 3/1984 | Dietz et al. | 428/427 |
| 4,459,166 | 7/1984 | Dietz et al. | 106/1.13 |
| 4,463,030 | 7/1984 | Deffeyes et al. | 106/1.14 |
| 4,652,465 | 3/1987 | Koto et al. | 427/216 |

Primary Examiner—Josephine Barr
Attorney, Agent, or Firm—Cushman, Darby & Cushman

[57] ABSTRACT

Silver flake having an organo-silver surfactant thereon. Preferably the surfactant is silver stearate. The flake is made by milling silver powder and the surfactant in a liquid medium in which the surfactant is insoluble. The flake makes possible silver-filled paste of improved properties.

7 Claims, No Drawings

METAL FLAKE AND USE THEREOF

The present invention relates to an improved silver flake and its use in silver-filled glass metallizng compositions or pastes.

BACKGROUND OF THE INVENTION

Silver-filled glass pastes are extensively used for bonding semi-conductive devices to ceramic substrates. See, for example, U.S. Pat. Nos. 3,479,774; 4,401,767; 4,436,785; 4,459,166 and Ser. No. 801,389, the disclosures of these patents and application being incorporated herein by reference.

Broadly speaking, these prior art pastes comprise a mixture of silver powder or flake and glass particles or frit in a liquid organic vehicle. The vehicle usually comprises an aliphatic hydrocarbon or alcohol with a small amount of thermoplastic polymer, e.g., an acrylate or methacrylate, dissolved therein.

Pastes of the above type are now extensively used for bonding semi-conductive devices to ceramic substrates and they demonstrate a variety of advantages over prior compositions, e.g., gold-based bonding compositions. However, notwithstanding the advantages of the silver-based compositions exemplified in said above-mentioned patents and application, it is still desirable to have compositions which wil provide even further improvements in performance.

BRIEF DESRIPTION OF THE INVENTION

The present invention is based on the finding that the performance of the above-noted silver-filled pastes can be substantially improved by using silver flake which has itself been processed in a special way. Use of this specially-prepared silver flake has been found to give pastes which have a stable viscosity over a wide range of storage and application temperatures. This is a very important feature because it insures consistent paste performance. Other advantaes of paste based on the improved flake of the invention include reduced ionic levels, resistance to glass migration, and improved dispensing and adhesion under marginal conditions.

Broadly described, the flake of the invention is prepared by milling silver power and an organo-silver surfactant, preferably silver stearate, in a liquid medium in which the organo-metallic surfactant is insoluble. Preferably, the liquid medium is the same as the solvent subsequently used to make the paste, e.g., texanol, but in any case, the surfactant should be insoluble in both the milling medium and the paste vehicle. It appears that, as a result of the milling operation and the choice of surfactant and milling medium, the surfactant, e.g., silver stearate or its equivalent, tightly bonds to the surface of the flake and remains so when incorporated into the paste.

As noted, silver stearate is the preferred surfactant for use herein. However, other organo-metallic surfactants may also be used provided they are, as noted, insoluble in the milling or grinding medium and in the paste vehicle. These insolubility characteristics for the surfactant are essential to the invention because they insure that the surfactant remains on the flake during storage and application of paste based thereon. This greatly improves the stability of the pastes, particularly where they need to be stored at higher than normal temperatures. Apparently, stability problems in prior art compositions, which result in increased viscosity, come about because the paste vehicle dissolves away any surfactant associated with the flake. The insolubility of the present surfactant is, therefore, of fundamental importance.

The improved resistance of pastes made with the present flake, to glass (lead) migration and resultant staining, is also thought to be due to the fact that the surfactant is bound to the surface of the flake and is not soluble in the paste vehicle.

U.S. Pat. No. 4,273,583 describes silver flake having a chemisorbed layer of dispersant containing olefinic unsaturation and a carboxylic acid group, such as oleic acid. The flake is used to make thick film pastes. However, oleic acid and similar surfactants are not suitable for present purposes because they cause undesirable discoloration and also tend to be dissolved by the paste vehicle, thus causing paste instability evidence by increasing viscosity and other problems.

DETAILED DESCRIPTION OF THE INVENTION

In a preferred embodiment, the silver flake of the invention is prepared by grinding or milling silver powder with silver stearate in texanol. As indicated, other organo-silver surfactants and milling media may be used provided the surfactant is not soluble in the medium used or in the paste vehicle. Texanol has been shown to be an especially useful paste vehicle and, therefore, is also desirably used as the milling medium, although it is not essential to do so. In any case, the milling medium and surfactant should be chosen to avoid discoloring the milling solution and/or paste obtained therefrom. Kerosene and toluene, for example, have been found to cause discoloration which is not considered desirable.

Typically, the silver flake of the invention is used in pastes which consist essentially of:

25 to 95% silver flake having a surface area of at least about 0.2 $m^2/gm$, preferably 0.2 to 1.0 $m^2/gm$, and a tap density of at least about 2.2 gm/cc;

75 to 5% of a substantially sodium-free glass frit, preferably a high lead borate glass frit, having a softening temperature below 425° C., preferably in the range of 325° to 425° C., a coefficient of thermal expansion no higher than about 13 ppm/°C., a surface area of at least about 0.3 $m^2/gm$, and a tap density of up to 3.6 gm/cc; and a liquid organic vehicle in an amount sufficient to provide a percent solids in the paste of about 75 to 85%.

Advantageously, the silver flake has a surface area of 0.2 to 1.0 $m^2/gm$ and the glass frit is such that it has a softening point in the range of 325° to 380° C., and coefficient of thermal expansion in the range of 10–13 ppm/°C., a surface area of 1.6 2.5 $m^2/gm$ and a tap density in the region of about 2.0–3.5 gm/cc.

Any glass, particularly high lead borate, sodium-free glass, which has the indicated properties may be used for present purposes. Preferably, however, the glass consists essentially of PbO and $B_2O_3$, usually in the range of 70–95% PbO ad 30–5% $B_2O_3$. A partcularly useful glass comprises 78% PbO and 22% $B_2O_3$.

The liquid organic vehicle employed is one which is inert and permits easy formulating and application. The vehicle should also be readily volatized and/or burnt off without leaving any undesired residue. It is particularly useful to use a vehicle which comprises a small amount of a thermoplastic polymer, e.g., an acrylate or methacrylate polymer, dissolved in an aliphatic hydrocarbon or alcohol. This includes, for example, a combination of ethyl methacrylate, actually poly (ethyl methacrylate), and terpineol. Preferably, however, the vehicle comprises a mixture of the poly (ethyl methacrylate) or like polymer or resin in texanol, the latter being 2,2,4-trimethyl-1,3-pentane diol-monoisobutyrate. Normally, the polymer or resin will comprise 5–15% by weight of the vehicle with the solvent, e.g., terpineol or texanol, making up the balance of the paste vehicle.

The pastes of the invention are prepared and used essentially as described in the above-mentioned patents or application. A typical use of the present paste will be as the bonding means employed in preparing electrical circuit modules according to U.S. Pat. No. 3,497,774, although it will be recognized by those in the art that a variety of other uses are also contemplated.

The invention is illustrated, but not limited by the following example:

EXAMPLE 9.6 grams of silver stearate and 2000 grams of silver powder were added to 700 mls. of texanol in a 2-liter beaker. The mixture was stirred until all the silver powder was wet with the solvent. The resulting slurry was then transferred to an 8"×8" flange mill containing 4.5 kg of ¼" stainless steel balls and 4.5 kg of 3/16" balls and milled for about 8 hours at 84 RPM. The resulting flake was washed wth a 50/50 mixture of acetone and isopropyl alcohol to give a product having about 0.3% by weight of surfactant bonded to, or absorbed on, the flake surface.

The thus-obtained flake is then used as the flake component in a paste of the following composition to give a product demonstrating the improved properties referred to above:

|  | By Weight |
|---|---|
| Silver flake | 66.4 |
| Glass Frit (78% PbO, 22% $B_2O_3$) | 16.6 |
| Vehicle (texanol containing 10% polyethyl methacrylate) | Balance |

The paste has a viscosity of about 20 Kcps as measured on a Brookfield RVT viscometer at 25° C. The viscosity remains substantially the same even after storage at elevated temperature.

The silver powder used as starting material was prepared by dissolving silver shot (1500 T.O.) in nitric acid so as to form a solution of silver nitreate. Silver carbonate was then precipitated by adding ammonium carbonate to the nitrate solution. Hydrazine hydrate was then added to give a silver powder precipitate. The precipitate was slurried with acetic acid, washed with water, dried and screened through 170 mesh for use.

The silver stearate used herein may be obtained from commercial sources or it may be prepard by, for example, reaction between silver nitrate and sodium stearate.

As indicated, silver flake processed according to the present invention can be used to provide silver based pastes which are characterized by, for example, improved stability, lead migration resistance, and improved dispensing. The silver stearate or like surfactant forms a tight bond to the silver flake and does not dissolve in the paste solvent system (e.g., texanol). This has a direct impact on the resistance to stain due to glass (lead) migration in the final paste. In addition, the resistance of the surfactant to removal results in improved stability of the final paste at elevated temperatures. Ferrante-Shirley rheograms indicate the present flake has excellent reproducible flow characteristics due to the uniform wetting of the material in the flaking process. These properties result in improved dispension.

The present flake also appears to sinter less than conventional flake material and results in lower shrinkage. This provides a lower wet-to-fired thickness reduction allowing lower material usage. In addition, the present flake has a directional improvement in adhesion under marginal conditions. It is also noted that the present flake makes possible a lower sodium or potassium ionic level due to the method used to precipitate the starting silver powder.

As noted, a particularly preferred feature of the invention is to use the same organic liquid vehicle in grinding or milling the flake with the surfactant as is subsequently used as the paste vehicle. This aids the flake in wetting when processed into a paste. The insolubility of the organo-silver surfactant is also critical as this allows the surfatant to be milled onto the surface of the flake and be retained there after the flake has been washed to remove the solvent and processed to a dry powder. This organo-silver compound, while insoluble in most solvents, is also more stable when heated in organic solvents than its precursor stearate.

The significance of using the indicated surfactant as disclosed herein is highlighted by the results obtained using other combinations of surfactants and solvents. For example, silver flake prepared using kerosene and toluene as solvents and oleic acid as the surfactant, resulted in an undesirabe dark brown discoloration in the paste. Substituting a saturated fatty acid (stearic acid) for the unsaturated oleic acid avoided the brown color in the solvent and paste, but the stability of the paste was unsatisfactory.

Replacing the kerosens/toluene system with texanol when the surfactant is stearic acid improves some properties, e.g., the wetting characteristics of the flake. However, this does not improve the viscosity stability of the paste. Apparently, the viscosity stability problem is due to the solubility of the surfactant (stearic acid) in the texanol. As the texanol dissolves the stearic acid off the surface of the flake, new flake surfaces are exposed and this phenomenon apparently causes the vehicle/solvent to be continuously removed from the paste to wet the flake thereby causing the viscosity of the paste to increase. Use of the insoluble surfactant, e.g., silver stearate, as specified herein, avoids this stability problem. Silver stearate is insoluble in texanol and most solvents and it is possible for silver stearate to be added to silver powder before milling to deposit a reproducible amount of siler stearate on the finished flake while exhibiting superior wetting in paste. The system of texanol and silver stearate, in particular, produces a flake that, when made into paste, shows slight variation from initial viscosity and excellent long-term stability.

It will be appreciated that various modifications may be made in the invention as described above. Accordingly, the scope of the invention is defined in the following claims wherein:

I claim:

1. Silver flake having an organo-silver surfactant thereon, said surfactant being insoluble in 2,2,4-trimethyl-1,3-pentane diol-monoisobutyrate.

2. The flake of claim 1, wherein the surfactant is silver stearate.

3. A process for preparing the flake of claim 1, which comprises milling silver powder and the surfactant in a liquid medium in which the surfactant is insoluble.

4. The process of claim 3, wherein the liquid medium is 2,2,4-trimethyl-1,3-pentane diol-monoisobutyrate.

5. In a silver-filled paste comprising glass frit, silver flake and a liquid vehicle, the improvement which includes, as the silver flake, the flake of claim 1.

6. The paste of claim 5, wherein the surfactant is silver stearate.

7. The paste of claim 6, wherein the liquid vehicle comprises 2,2,4-trimethyl-1,3-pentane diol-monoisobutyrate.

* * * * *